US007015587B1

(12) United States Patent
Poddar

(10) Patent No.: US 7,015,587 B1
(45) Date of Patent: Mar. 21, 2006

(54) STACKED DIE PACKAGE FOR SEMICONDUCTOR DEVICES

(75) Inventor: Anindya Poddar, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/936,151

(22) Filed: Sep. 7, 2004

(51) Int. Cl.
*H01L 23/52* (2006.01)
*H01L 23/48* (2006.01)
*H01L 29/40* (2006.01)

(52) U.S. Cl. .................. 257/777; 257/666; 257/685; 257/686; 257/783; 257/790; 438/108; 438/109; 361/760

(58) Field of Classification Search ................ 257/E25.031–E25.032, E27.137, E23.042, 257/E27.161, E27.144, 685, 686, 666, 777, 257/790, 783; 438/108, 109, FOR. 368, 438/FOR. 426; 361/760
See application file for complete search history.

(56) References Cited

U.S. PATENT DOCUMENTS

| | | | | |
|---|---|---|---|---|
| 5,863,810 | A * | 1/1999 | Kaldenberg | 438/27 |
| 6,340,846 | B1 * | 1/2002 | LoBianco et al. | 257/783 |
| 6,518,655 | B1 * | 2/2003 | Morinaga et al. | 257/678 |
| 6,521,881 | B1 * | 2/2003 | Tu et al. | 250/208.1 |
| 6,545,365 | B1 * | 4/2003 | Kondo et al. | 257/777 |
| 6,552,416 | B1 * | 4/2003 | Foster | 257/666 |
| 6,677,674 | B1 * | 1/2004 | Nagao | 257/724 |
| 6,720,662 | B1 * | 4/2004 | Den | 257/777 |
| 6,768,212 | B1 * | 7/2004 | Karashima et al. | 257/784 |
| 6,897,088 | B1 * | 5/2005 | Hedler et al. | 438/102 |
| 2003/0189259 | A1 * | 10/2003 | Kurita et al. | 257/777 |
| 2004/0012080 | A1 * | 1/2004 | Hedler et al. | 257/678 |

OTHER PUBLICATIONS

Slide from a presentation illustrating Stacked-die Solutions, 2004.

* cited by examiner

*Primary Examiner*—Kenneth Parker
*Assistant Examiner*—Chris C. Chu
(74) *Attorney, Agent, or Firm*—Beyer Weaver & Thomas LLP

(57) ABSTRACT

A stacked multi-chip package is described in which a base die is electrically connected to both an interconnect structure (e.g., a lead frame or a substrate) and a stacked die. A first encapsulant is used to cover some, but not all of the bond pads on a base die as well as portions of their associated electrical connectors (e.g. bonding wires). A surface of the first encapsulant is arranged to support the stacked die. The stacked die is directly electrically connected to bond pads that are not covered by the first encapsulant. A second encapsulant at least partially encapsulates the base and stacked dice and the various electrical connectors. With this arrangement, a stacked multi-chip semiconductor package is provided that includes a direct die-to-die electrical connection. The described arrangement is particularly well suited for use in packages, such as many power packages, in which at least one of the bond pads on the die is centrally located on the active surface of the die and the first encapsulant covers at least a portion of an electrical connector attached to the centrally located bond pad.

10 Claims, 4 Drawing Sheets

STACKED DIE PACKAGE FOR SEMICONDUCTOR DEVICES

BACKGROUND OF THE INVENTION

The present invention relates generally to the packaging of integrated circuits. More particularly, the invention relates to a stacked die configuration that permits a stacked die to be electrically connected to the die it is stacked on.

There are a number of conventional processes for packaging integrated circuits. In many situations it is desirable to incorporate multiple integrated circuit dice into the same package in what is commonly referred to as a multi-chip package. Some multi-chip packages are arranged to stack two or more dice on top of each other. These stacked die packages have several potential advantages including the possibility of a reduced die or package footprint and certain performance advantages (e.g., by reducing the path length of electrical connections between integrated circuits and thus potentially increasing speed and reducing inductance of inter-chip communications).

One stacked die configuration is generally illustrated in FIG. 1. In this configuration a first die 104 is mounted on a planar substrate 106. Bonding wires 108 are then used to electrically connect the first die 104 to the substrate 106 using conventional wire bonding. After wire bonding, an encapsulant 108 is screen printed over first the die 104 to form an internal package structure 110 that covers the first die. A second die 113 may then be adhesively secured to the top surface of the internal package 110 thereby creating a stacked die configuration. The second die 113 is then wire bonded to the substrate and an encapsulant material 115 is molded over the substrate to provide an encapsulant cap. Although this process can be used to create stacked die packages, the top die cannot be wire bonded directly to the bottom die because the screen printed encapsulant used to form the internal package structure covers all of the various bond pads. Since screen printing is used to form the internal packages, the process is not well suited for use with lead frames. Additionally, spacers may be required between adjacent device areas on the substrate panel to support the screen. The spacers take up valuable space on the substrate panel thereby reducing the device density on the panel.

Another stacked die approach is generally illustrated in FIG. 2. In this approach, an adhesive material 130 having ball like spherical support structures 132 therein is dispensed on the top surface of the lower die 138 in a region that is interior to the bond pads. The balls 132 effectively provide structural support for the adhesive so that the adhesive can be formed into a plateau that can be used to support a second die 141 (which includes a top surface 135). Both the top die 141 and bottom die 138 can be wire bonded (e.g., 127) to a substrate 120 or a lead frame after the dice have been stacked. However, the presence of the balls in the adhesive prevents the adhesive from being used to encapsulate the bonding wires, which limits the permissible size of the top die. Additionally, this approach does not work well in power chips, which frequently have bond pads located near the middle of the active surface.

FIG. 3 illustrates a stacked die approach that has been used in power die applications. In the illustrated embodiment, a power die 145 has several elongated bus bar styled bond pads 150 (e.g., 150a, 150b, 150c) and 152 (e.g., 152a, 152b, 152c) that are suitable for connection to multiple bonding wires 151 as well as some smaller bond pads 154 that are suitable for connection to a single bonding wire 159. Some of the bond pads (e.g., pad 150(b)) are located or extend into a middle region of the power die 145. A second die 156 is then adhered directly to the top surface of the base die 145 and electrically connected to the base die by bonding wires 157. This stacked die approach works allows the top die to be electrically connected to both the underlying base die 145 and to a substrate or lead frame. However, the placement of the stacked die 156 directly on the base die 145 prevents the placement of bond pads on a significant amount of the active surface of the base die which may force the use of larger base dies than may otherwise be necessary for a particular application.

Although the described techniques work well in many applications, in the semiconductor industry, there are continuing efforts to provide more efficient approaches stacking integrated circuits. The described packaging arrangements are particularly useful in stacking devices (such as power devices) that require die-to-die electrical connections.

SUMMARY OF THE INVENTION

To achieve the foregoing and other objects of the invention new stacked die multi-chip semiconductor packages and packaging methods are described. In a package structure aspect of the invention a stacked die arrangement is provided in which a base die is electrically connected two both a interconnect structure (e.g., a lead frame or a substrate) and the stacked die. A first encapsulant is used to cover some, but not all of the bond pads on a base die as well as portions of their associated electrical connectors (e.g. bonding wires). A surface of the first encapsulant is arranged to support the stacked die. The stacked die is directly electrically connected (using for example bonding wires) to bond pads that are not covered by the first encapsulant. A second encapsulant at least partially encapsulates the base and stacked dice, and the various electrical connectors. With this arrangement, a stacked multi-chip semiconductor package is provided that includes a direct die-to-die electrical connection.

The described arrangement is particularly well suited for use in packages, such as many power packages, in which at least one of the bond pads on the die is centrally located on the active surface of the die and the first encapsulant covers at least a portion of an electrical connector attached to the centrally located bond pad.

In a method aspect of the invention, a first die is electrically connected to a lead frame or a substrate. A first encapsulant is then dispensed to form a plateau on the active surface of the first die. The encapsulant plateau is arranged to cover some of the bond pads and at least partially encapsulates electrical connectors that are electrically coupled to such bond pads. A second die is then attached to the plateau forming a stacked die arrangement. The stacked (second) die is then electrically connected the bond pads on the base die that are not covered by the encapsulant plateau, and if appropriate to the leadframe or substrate structure. After the second die has been electrically connected, both the first and second dice are encapsulated to form a stacked multi-chip package.

In some embodiments, a dam structure is formed on an active surface of the first die to constrain the plateau. The dam structure may be arranged to isolate a first set of the bond pads, but not all of the bond pads located on the active surface of the die. The plateau is arranged to cover the bond pads isolated by the dam structure.

BRIEF DESCRIPTION OF THE DRAWINGS

The invention, together with further objects and advantages thereof, may best be understood by reference to the following description taken in conjunction with the accompanying drawings in which.

It is to be understood that, in the drawings, like reference numerals designate like structural elements. Also, it is understood that the depictions in the figures are diagrammatic and not to scale.

DETAILED DESCRIPTION OF THE PREFERRED EMBODIMENTS

Figure 4:
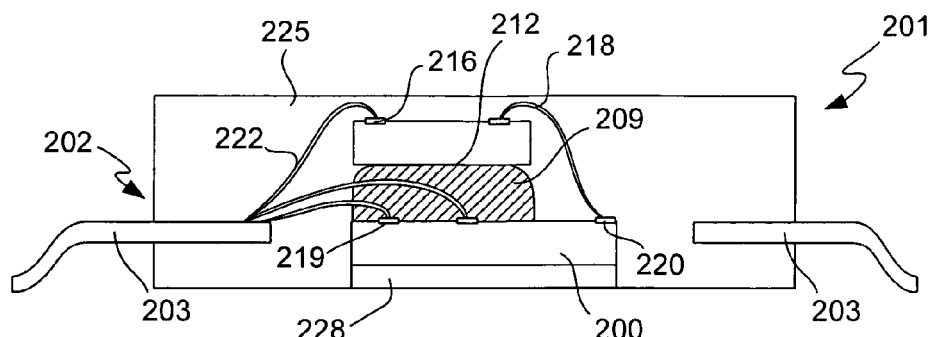
FIG. 4 is a diagrammatic cross sectional view of a stacked die leadframe based package in accordance with one embodiment of the present invention.

The present invention relates generally to the packaging of stacked semiconductor devices having direct die-to-die electrical connections. Referring initially to FIG. 4, a leadframe based stacked multi-chip package 201 that accommodates die-to-die electrical connections in accordance with one embodiment of the invention will be described. In the illustrated embodiment, a base die 200 is adhesively adhered to the die attach pad 228 of a lead frame 202. The base die 200 is electrically connected to the leadframe 202 using appropriate techniques such as wire bonding. More specifically, selected bond pads 219 on the base die 200 are electrically connected to associated leads or contacts 203 on leadframe 202 via bonding wires 207 or other suitable connectors. A first encapsulant 209 is dispensed on the active surface of the die 200 such that it covers at least portions of the bonding wires 207 that are electrically connected to the leadframe 202, as well as their associated bond pads. The top surface of the encapsulant 209 forms a support surface 212 that supports a second (or stacked) die 215.

The second die 215 may be secured to the support surface 212 using any of a variety of conventional die attach processes, as for example by adhesive bonding. The stacked die 215 is electrically connected to the base die 200 using bonding wires 218. More specifically, bond pads 216 on the active surface of the stacked die 215 are wire bonded, as appropriate, to associate bond pads 220 on the active surface of the base die 200 that are not covered by the first encapsulant 209, thereby forming direct die-to-die electrical connections between the base die 200 and the stacked die 215. In the illustrated embodiment, the stacked die is also electrically connected to the leadframe 202 as appropriate via bonding wires 222. The need and/or desirability of electrically connecting the stacked die directly to the leadframe will depend entirely on the nature of the chips involved. A second encapsulant 225 encapsulates the die stack, the various bonding wires and portions of the lead frame 202 thereby forming a package around the stacked semiconductor devices. The second encapsulant 225 can be applied using any appropriate encapsulation technology such as molding, screen or stencil printing, dispensing, etc.

It should be appreciated that the first encapsulant 209 does not cover all of the bond pads on the top (active) surface of the base die 200. Rather, it forms a plateau over the base die that serves as a support structure for the stacked die. With this arrangement, some of the bond pads (e.g., bond pads 220) on the active surface of the base die 200 are not covered by the first encapsulant 209. Therefore, as will be described in more detail below, during fabrication, the stacked die 215 can be electrically connected to the base die 200 after it has been mounted thereon to facilitate direct die-to-die electrical connections.

Figure 1:
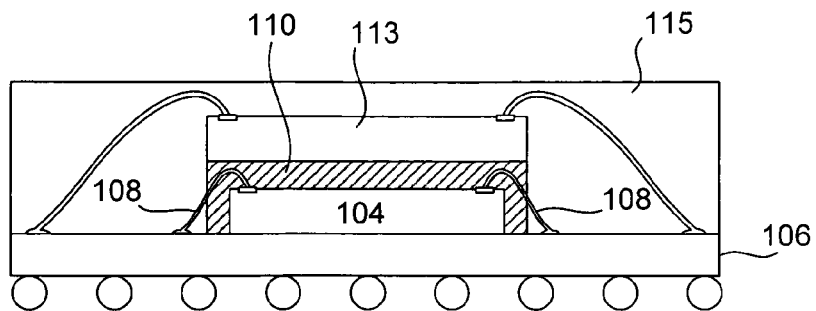
FIG. 1 is a diagrammatic cross sectional view of a stacked die package having a screen printed cap surrounding the lower die.
Figure 2:
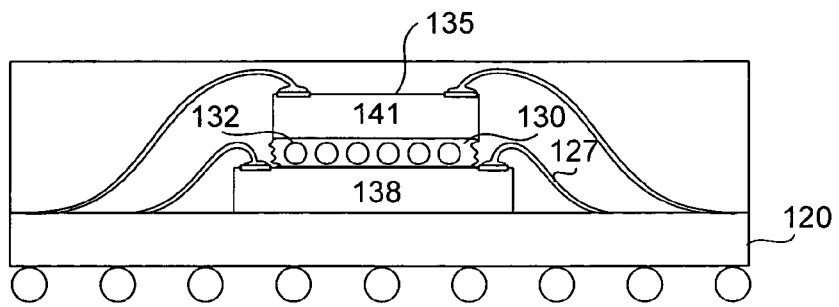
FIG. 2 is a diagrammatic cross sectional view of a stacked die package having an adhesive support plateau formed inside a ring of bond pads.
Figure 3:
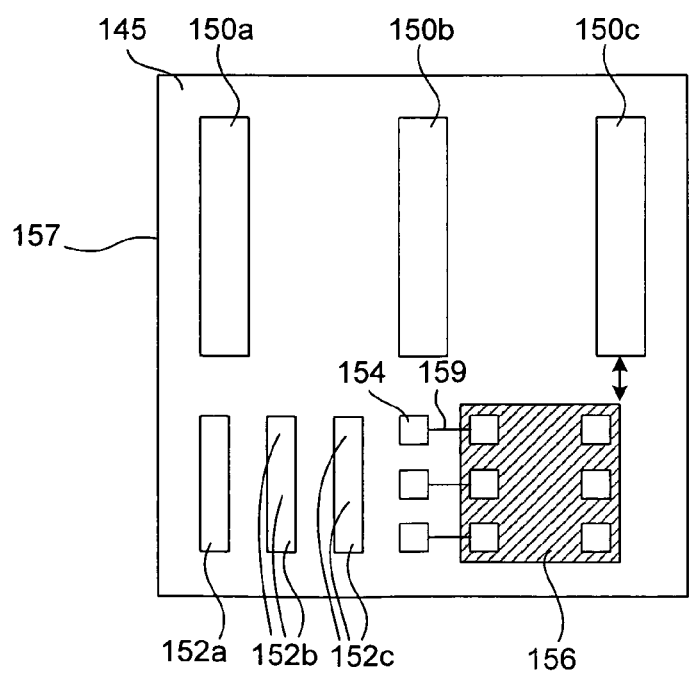
FIG. 3 is a diagrammatic cross sectional view of a stacked power die arrangement.

Although one particular implementation is illustrated in FIG. 4, it should be appreciated that the invention may be implemented in a wide variety of alternative arrangements. In the embodiment illustrated in FIG. 1, the base die 200 is attached to a conventional leaded lead frame as might be used in a quad flat pack (QFP), an inline package (e.g. a dual in-line package (DIP) or a small outline (SO) type package) or in a variety of other leaded leadframe based packages. In other embodiments, the stacked dice may be used in leadless leadframe based packages (e.g. quad flat pack no leads (QFN) packages, microarray packages, etc). The base die 200 may be supported by a conventional die attach pad 228 as illustrated in FIG. 4 or other suitable lead frame structures, such as leads, posts etc. In other embodiments, the described stacking arrangement can be used in exposed die applications where the base die 200 is not directly supported by a die attach pad or any other lead frame structure.

Figure 5:
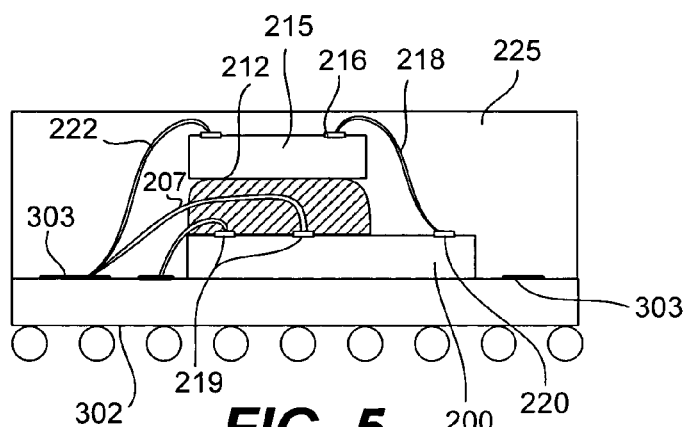
FIG. 5 is a diagrammatic cross sectional view of a stacked die substrate based package in accordance with a second embodiment of the present invention.

In still other embodiments, the stacking approach may be used in substrate based packages such as the embodiment illustrated in FIG. 5. In that embodiment, the base die 200 is attached to a substrate 302 and is electrically connected to traces 303 on the top surface of the substrate 302. Similarly, when appropriate, selected bond pads on the top die 215 may be electrically connected to associated substrate traces 303.

Figure 8:
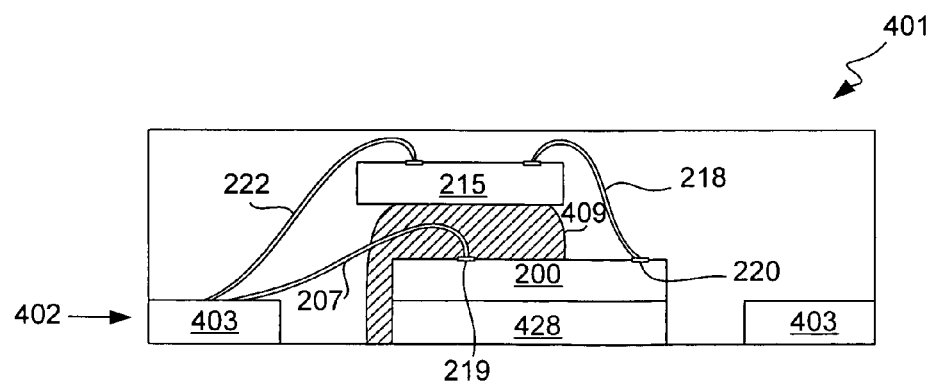
FIG. 8 is a diagrammatic cross sectional view of a stacked die leadframe based package in accordance with another embodiment of the present invention.

Referring next to FIG. 8, yet another embodiment 401 of the invention will be described. In this embodiment, the first encapsulant is not constrained to the top surface of the base die 200. Rather, the plateau 409 formed by the first encapsulant extends past one (or more) of the sides of the base die 200. In other respects, the stacked dice are packaged in much the same manner as described above with respect to FIG. 5. The extended plateau 409 provides a larger support surface and is particularly useful in applications where the stacked die 215 is larger (or significantly larger) than the area that would be available if the plateau was constrained to a segment overlying the available portion of the base die. In the embodiment illustrated in FIG. 4, the upper die 215 has a slightly smaller footprint than the support surface of the first encapsulant plateau 209. However, this is not in any way a requirement. The package can readily be arranged so that the upper die 215 overhangs the supporting plateau. One such overhanging configuration is illustrated in FIG. 8. Of course, it is important to insure that the overhanging does not interfere with any desired subsequent wire bonding.

It is also noted that, the embodiment in FIG. 8 illustrates the use of the invention in the context of a QFN or leadless leadframe (LLP) type package. The illustrated embodiment utilizes a lead frame 402 having a die attach pad 428 and a plurality of contacts 403 that are exposed on a bottom surface of the package 401.

Figure 9:
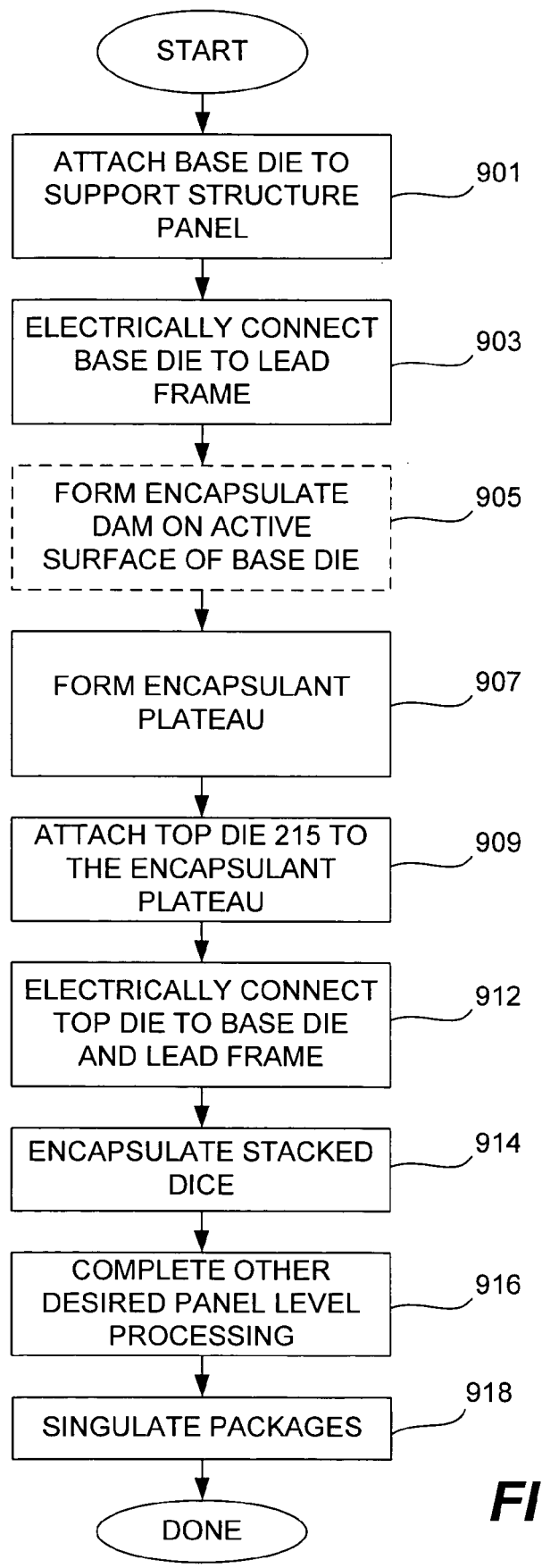
FIG. 9 is a flow diagram illustrating a process of packaging integrated circuits in accordance with one embodiment of the invention.

Referring next to FIG. 9, a packaging process suitable for fabricating the described packages will be described. Initially, in step 901 the base die 200 is attached to a suitable support structure panel using standard die attach approaches. For example, in leadframe based packages 201, 401 that include a die attach pad 228, 428, the die may be attached to the die attach pad using an adhesive or other conventional approaches. In embodiments that contemplate the use of a leadframe with an exposed base die, the die may be placed on a support tape that carries the leadframe. In embodiments where the base die is secured to a substrate, as for example in a BGA (Ball Grid Array) or PGA (Pin Grid Array) type configuration, the base die may be attached to the substrate by any suitable die attach mechanism such as a die attach adhesive.

As will be appreciated by those familiar with the art, the die attachment (as well as most of the described packaging steps) will typically be done in panel form. That is, a lead frame (or substrate) panel (or strip) is typically provided that has at least one array of device areas thereon. When smaller devices are being packaged, the panel will often multiple two dimensional arrays of device areas. A base die 200 is attached to each device area in the panel.

After the base dice have been attached to their associated support structures, the base dice are electrically connected to their associate leads/contacts on a lead frame or traces/pads on a substrate in step 903. For the convenience of the discussion that follows, it will be assumed that the base dice are being attached to a lead frame panel having a die attach pads. However, it should be appreciated that equivalent steps would be performed when other die support structures are used.

In the primary described embodiment, wire bonding is used to electrically connect the base die, however it should be appreciated that other interconnect structures could be used as well. The wire bonding operation provides the bonding wires 222 illustrated in FIGS. 4 and 8 that electrically connect specific bond pads 219 on the base dice 200 to their associated leads 203. Of course, any appropriate wire bonding may be performed at this point. For example, if desired, the dice may be downbonded to their associated die attach pads, to power/ground strips or to other specific lead frame structures.

Figure 6:
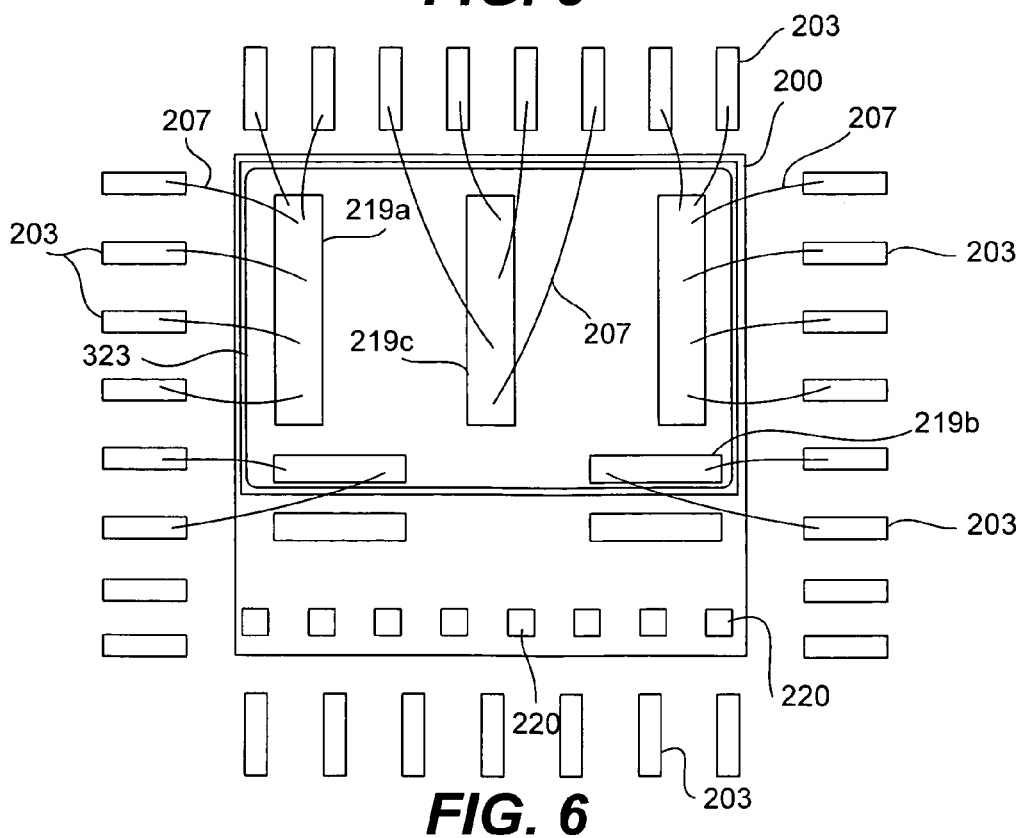
FIG. 6 is a diagrammatic top view of a dam formed on the active surface of a base die in accordance with one embodiment of the present invention.

After the initial wire bonding, the encapsulant plateau 209 is formed. The plateau 209 may be formed in a variety of ways. By way of example, in some embodiments, the plateau may be formed using dispensing process controls to limit the spread of the encapsulant materials. In other embodiments an affirmative structure, such as a dam may be used to contain the encapsulant. In the illustrated embodiment, a dam 323 may be formed on the top surface of each base die 200 as best illustrated in FIG. 6. Since the formation of the dam is optional, the dam formation step 905 is shown in dashed lines in FIG. 9. The dam 323 is designed to constrain the location of the first encapsulant material. The dam may be formed from a wide variety of materials. By way of example, dispensing a line of semiconductor compatible epoxy material works well. In the illustrated embodiment, the dam 323 has a consistent height and encircles a region of the active surface of the base die 200 that includes a number of bond pads 219. This arrangement is well suited for forming a plateau that sits entirely on top of the base die as illustrated in FIGS. 4 and 5. In other embodiment, the dam 323 may not completely surround a region. Rather it may rely on an edge of the die to serve as one of the boundaries for the plateau, or the dam may extend over an edge of the die to facilitate the formation of an overhanging plateau as illustrated in FIG. 8.

Figure 7:
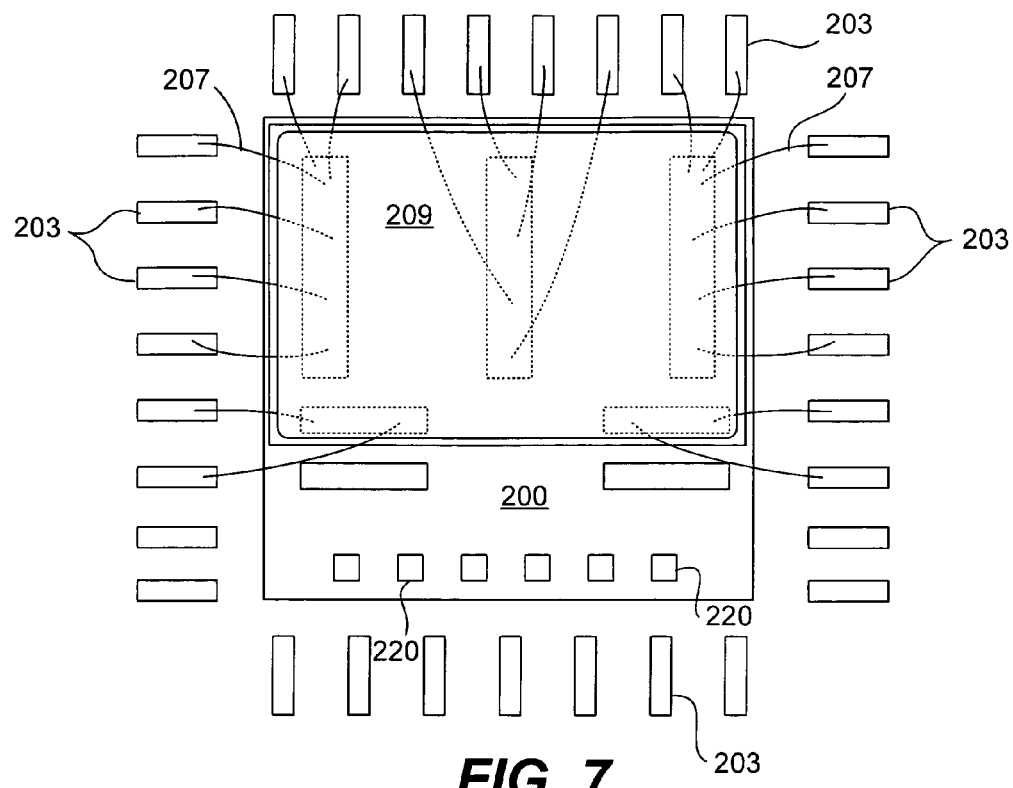
FIG. 7 is a diagrammatic top sectional view of an encapsulant plateau formed on the active surface dam formed on the active surface of a base die in accordance with one embodiment of the present invention.

After the dam 323 has been formed, the region bounded by the dam is filled with an encapsulant material. Step 907. This may be done by dispensing a suitable encapsulant material, such as an epoxy type material, into the region surrounded by the dam. The encapsulant material is preferably dispensed in a substantially liquid form and is dispensed in a volume suitable to fill the bounded area to the top of the dam 323. With this arrangement, the liquefied form of the encapsulate levels itself quite well so that when the encapsulant hardens, a plateau 209 having a level top surface is formed in the region bounded by the dam 323. The top surface of the plateau can then serve as the support surface 212 for the top die. FIG. 7 is a top view of the die illustrated in FIG. 6, after the first encapsulant has been dispensed to form an encapsulant plateau 209.

It should be appreciated that in other embodiments, the encapsulant plateau 209 can be formed in a variety of other manners. By way of example, in some embodiments, it may be desirable to use a glob topping type of process that does not require the use of any dam structures. However, with current technology, it is difficult to form a well constrained plateau having a very flat top surface using a pure glob topping approach.

After the plateau has been formed, a second die 215 may be attached to the support surface of the first encapsulant. Step 909. Any suitable die attach mechanism may be used. By way of example, adhesive bonding works well. In most embodiments, the die attach will be done using a separate adhesive. However, in some embodiment, the first encapsulant material may be formulated in a way (as for example as a B-stageable adhesive) such that it may be used to secure the top die 215 in place.

After the top die has been attached, the second die may be wire bonded (or otherwise electrically connected) to the base die 200 and/or the lead frame 202 as appropriate. Step 912. Specifically, the top die 215 is electrically connected to the base die 200 using bonding wires 218, and if appropriate, the top die is also electrically connected to the leadframe 202 using bonding wires 222.

After the top die has been electrically connected, the stacked dice may be encapsulated (step 914) using conventional molding or other suitable encapsulation techniques. Again, it should be appreciated that the molding (like the other previously described packaging steps), will typically be done in panel (or strip) form. Depending upon the nature of the packages being formed, the device areas in a lead frame panel may be either individually molded or group molded in a one or two dimensional array of device areas. In other embodiments, other encapsulation techniques such as glob topping or stencil printing may be used to encapsulate the device areas.

After the stacked dice have been encapsulated, any other desired panel level processing and/or testing may be done (step 916) and thereafter the device areas may be singulated in step 918 (as for example, by sawing) to form a plurality of independent stacked multi-chip packages. Of course, other packaging or processing steps may be performed at any appropriate stage of the process and in some circumstances the ordering of the various described steps may be altered without departing from the invention.

The die 200 illustrated in FIG. 6 is a power die that has a number of elongated bond pads 219*a*, 219*b*, 219*c* that are designed to have several bonding wires attached thereto. Some of the bond pads, as for example pad 219*c* extend into a middle region of the die. The described stacking structure is particularly beneficial when used in packages (such as many power packages) that have bond pads that are either located in or extend into a center region of the die. As can be seen in FIG. 7, the encapsulant plateau can be designed so that it encapsulates bonding wires connected to a center region of the base die so that a stacked die may be placed directly over the centrally located bonding wires.

Although only a few embodiments of the invention have been described in detail, it should be appreciated that the invention may be implemented in many other forms without departing from the spirit or scope of the invention. In the illustrated embodiments, the plateau formed by the first encapsulant is described as supporting a single die. However, it should be appreciated that when appropriate in view of the available support surface area, a variety of other electrical components could be supported in addition to, or some situations even in place of the described top die. For example, the encapsulant plateau could support multiple dice. Additionally, the encapsulant plateau 209 can support passive components (such as capacitors, resistors, inductors and the like) and/or other electrical components. In the described embodiments, a single plateau is formed by the first encapsulant. However, in alternative embodiments, multiple plateaus could be formed on the base die.

In the described embodiments, a two-chip stack is used. However, it should be appreciated that the concepts described herein are equally applicable to even higher tiered (e.g., three or more stacked chips) packages. Therefore, the present embodiments are to be considered as illustrative and not restrictive and the invention is not to be limited to the details given herein, but may be modified within the scope of the appended claims.

What is claimed is:

1. A stacked multi-chip semiconductor package comprising:
    a first die having a first plurality of bond pads exposed on a first surface of the first die;
    a first set of electrical connectors electrically coupled to selected bond pads on the first die;
    a first encapsulant that covers portions of the first set of electrical connectors and completely exposes some of the bond pads of, the first die, the first encapsulant including a support surface;
    a second die that is supported by the support surface of the first encapsulant, the second die having a second plurality of bond pads;
    a second set of electrical connectors electrically coupled to selected bond pads on the second die, wherein at least one of the second set of electrical connectors electrically connects the second die directly to at least one of the exposed bond pads of the first die; and
    a second encapsulant that at least partially encapsulates the first and second dice, and the first and second sets of electrical connectors, whereby a stacked multi-chip semiconductor package is provided that includes a direct die to die electrical connection.

2. A stacked multi-chip semiconductor as recited in claim 1 further comprising a lead frame having a plurality of leads, wherein at least some of the first set of electrical connectors and at least some of the second set of electrical connectors electrically connect their associated die to selected leads of the lead frame.

3. A stacked multi-chip semiconductor as recited in claim 1 further comprising a substrate having conductive traces formed thereon, wherein at least some of the first set of electrical connectors and at least some of the second set of electrical connectors electrically connect their associated die to selected traces on the substrate.

4. A stacked multi-chip semiconductor package as recited in claim 1 wherein:
    the second die is adhesively attached to the support surface; and
    the first and second sets of electrical connectors are bonding wires.

5. A stacked multi-chip semiconductor package as recited in claim 1 wherein at least one of the bond pads on one of the die comprises a centrally located bond pad that includes pad portions that are positioned closer to the center of the die than the edge of the die and are is centrally located on the active surface of the die and the first encapsulant covers at least a portion of a bonding wire attached to the centrally located bond pad.

6. A stacked multi-chip semiconductor package as recited in claim 5 wherein the first die is a power die and the centrally located bond pad is elongated and has a plurality of electrical connectors coupled thereto.

7. A stacked multi-chip semiconductor package as recited in claim 1 wherein the first encapsulant extends over an edge of the first die.

8. A stacked multi-chip semiconductor package as recited in claim 7 wherein the second die overhangs the support surface.

9. A stacked multi-chip power package comprising:
    a power die having a first plurality of bond pads exposed on an active surface of the power die, wherein at least one of the bond pads in an elongated bond pad located in a center portion of the active surface;
    a lead frame having a plurality of leads;
    a first set of bonding wires that electrically couple selected bond pads on the power die to associated leads, wherein a plurality of bonding wires are electrically connected to the elongated bond pad;
    a first encapsulant that covers portions of the first set of bonding wires and the elongated bond pad, but not all of the bond pads on the power die, the first encapsulant including a support surface;
    a second die that is adhesively bonded to the support surface, the second die having a second plurality of bond pads;
    a second set of bonding wires that electrically connect the second die to bond pads on the power die that are not covered by the first encapsulant and to associated leads, wherein at least one of the second set of bonding wires electrically connects the power die directly to the second die; and
    a second encapsulant that at least partially encapsulates the dice, portions of the lead frame and the bonding wires, whereby a stacked multi-chip power package is provided that includes a direct die to die electrical connection.

10. A stacked multi-chip semiconductor package comprising:
    a first power die having a first plurality of bond pads exposed on a first surface of the first die wherein at least one of the bond pads is centrally located at some distance away from the edges of the first die and located on an active surface of the first die and wherein the centrally located bond pad is elongated and has a plurality of electrical connectors coupled thereto;

a first set of electrical connectors electrically coupled to selected bond pads on the first die;

a first encapsulant that covers portions of the first set of bonding wires and some but not all of the bond pads on the first die, wherein the first encapsulant covers at least a portion of a bonding wire attached to the centrally located bond pad and wherein the first encapsulant including a support surface;

a second die that is supported by the support surface of the first encapsulant, the second die having a second plurality of bond pads;

a second set of electrical connectors electrically coupled to selected bond pads on the second die, wherein at least one of the second set of electrical connectors electrically connects the second die directly to the first die; and a second encapsulant that at least partially encapsulates the first and second dice, and the first and second sets of electrical connectors, whereby a stacked multi-chip semiconductor package is provided that includes a direct die to die electrical connection.

* * * * *

UNITED STATES PATENT AND TRADEMARK OFFICE
CERTIFICATE OF CORRECTION

| | |
|---|---|
| PATENT NO. | : 7,015,587 B1 |
| APPLICATION NO. | : 10/936151 |
| DATED | : March 21, 2006 |
| INVENTOR(S) | : Anindya Poddar |

It is certified that error appears in the above-identified patent and that said Letters Patent is hereby corrected as shown below:

In line 5 of claim 5 (column 8, line 19) delete "is centrally" after "are".

Signed and Sealed this

Third Day of October, 2006

JON W. DUDAS
*Director of the United States Patent and Trademark Office*